US 9,856,579 B2

(12) United States Patent
Leibiger et al.

(10) Patent No.: US 9,856,579 B2
(45) Date of Patent: Jan. 2, 2018

(54) METHOD AND DEVICE FOR MANUFACTURING SEMICONDUCTOR COMPOUND MATERIALS BY MEANS OF VAPOUR PHASE EPITAXY

(75) Inventors: Gunnar Leibiger, Freiberg (DE); Frank Habel, Freiberg (DE); Stefan Eichler, Dresden (DE)

(73) Assignee: FREIBERGER COMPOUND MATERIALS GMBH, Freiberg (DE)

( * ) Notice: Subject to any disclaimer, the term of this patent is extended or adjusted under 35 U.S.C. 154(b) by 0 days.

(21) Appl. No.: 13/010,112

(22) Filed: Jan. 20, 2011

(65) Prior Publication Data

US 2012/0021163 A1     Jan. 26, 2012

Related U.S. Application Data

(62) Division of application No. 12/039,886, filed on Feb. 29, 2008, now Pat. No. 9,074,297.

(Continued)

(30) Foreign Application Priority Data

Mar. 2, 2007 (DE) .................. 10 2007 010 286

(51) Int. Cl.
*C30B 25/00* (2006.01)
*C30B 25/02* (2006.01)
(Continued)

(52) U.S. Cl.
CPC .............. *C30B 25/00* (2013.01); *C30B 25/02* (2013.01); *C30B 25/14* (2013.01); *C30B 29/403* (2013.01);
(Continued)

(58) Field of Classification Search
CPC ....... C30B 25/00; C30B 25/02; C30B 29/403; C30B 29/406
(Continued)

(56) References Cited

U.S. PATENT DOCUMENTS 4,407,694 A * 10/1983 Eu et al. .................. 117/84
6,177,292 B1 * 1/2001 Hong .................. B82Y 20/00
117/952

(Continued)

FOREIGN PATENT DOCUMENTS

CN      1849410 A    10/2006
JP      10-182282 A    7/1998
(Continued)

OTHER PUBLICATIONS

Zhang e al. "Pulsed atomic layer epitaxy of quaternary AlInGaN layers" Applied Physic Letters vol. 79 No. 7 p. 925-927 (2001).*
(Continued)

*Primary Examiner* — Matthew Song
(74) *Attorney, Agent, or Firm* — Foley & Lardner LLP

(57) ABSTRACT

A semiconductor compound material, preferably a III-N-bulk crystal or a III-N-layer, is manufactured in a reactor by means of hydride vapor phase epitaxy (HVPE), wherein in a mixture of carrier gases a flow profile represented by local mass flow rates is formed in the reactor. The mixture can carry one or more reaction gases towards a substrate. Thereby, a concentration of hydrogen important for the reaction and deposition of reaction gases is adjusted at the substrate surface independently from the flow profile simultaneously formed in the reactor.

11 Claims, 3 Drawing Sheets

Related U.S. Application Data

Figure 1:
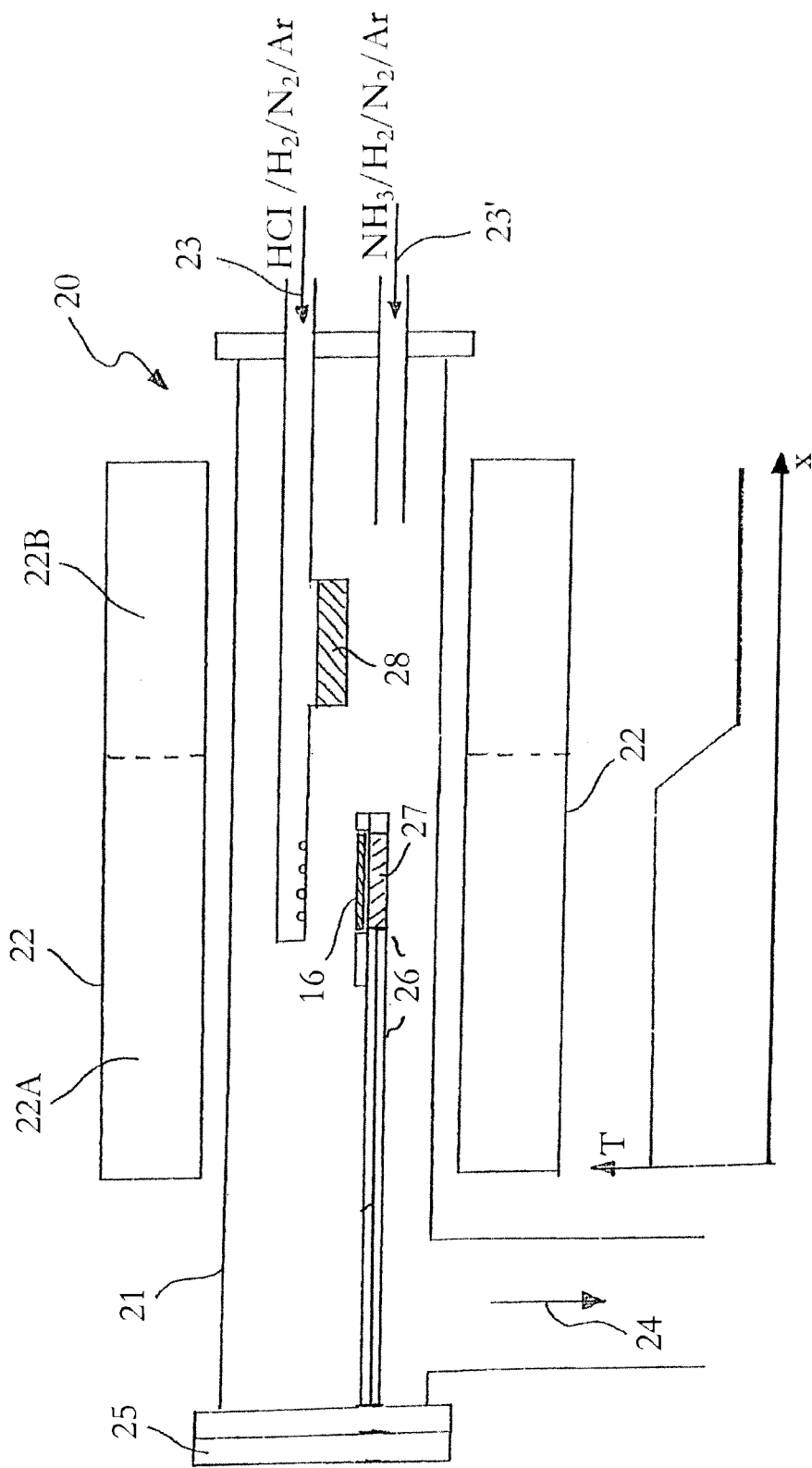

(60) Provisional application No. 60/892,635, filed on Mar. 2, 2007.

(51) Int. Cl.
*C30B 25/14* (2006.01)
*C30B 29/40* (2006.01)

(52) U.S. Cl.
CPC ............ *C30B 29/406* (2013.01); *Y10T 117/10* (2015.01); *Y10T 428/24612* (2015.01)

(58) Field of Classification Search
USPC ....... 257/613, 615; 117/84, 88, 98, 107, 952
See application file for complete search history.

(56) References Cited

U.S. PATENT DOCUMENTS

| | | | |
|---|---|---|---|
| 6,179,913 | B1 | 1/2001 | Solomon et al. |
| 6,355,107 | B1 | 3/2002 | Solomon et al. |
| 6,596,079 | B1 | 7/2003 | Vaudo et al. |
| 7,727,333 | B1* | 6/2010 | Syrkin et al. ................ 117/91 |
| 7,906,411 | B2 | 3/2011 | Wang et al. |
| 2003/0013222 | A1* | 1/2003 | Trassoudaine et al. ........ 438/46 |
| 2003/0019423 | A1* | 1/2003 | Ramdani et al. ............. 117/84 |
| 2003/0136957 | A1 | 7/2003 | Tsuda et al. |
| 2003/0228710 | A1* | 12/2003 | Drewes .......................... 438/3 |
| 2004/0221799 | A1* | 11/2004 | Nakayama et al. ........... 117/94 |
| 2005/0009221 | A1 | 1/2005 | Miyoshi et al. |
| 2005/0042789 | A1 | 2/2005 | Fujikura et al. |
| 2005/0142391 | A1* | 6/2005 | Dmitriev et al. ............ 428/698 |
| 2006/0011135 | A1* | 1/2006 | Dmitriev et al. ............ 118/718 |
| 2006/0037530 | A1* | 2/2006 | Dwilinski ................ C30B 7/00 117/70 |
| 2006/0046325 | A1 | 3/2006 | Usui et al. |
| 2006/0270200 | A1 | 11/2006 | Shibata |
| 2007/0071896 | A1 | 3/2007 | Murphy et al. |
| 2008/0132040 | A1 | 6/2008 | Wang et al. |
| 2009/0294774 | A1 | 12/2009 | Morioka et al. |
| 2010/0301358 | A1* | 12/2010 | Shibata .................... C30B 9/10 257/98 |

FOREIGN PATENT DOCUMENTS

| | | |
|---|---|---|
| JP | 11-001391 A | 1/1999 |
| JP | 2002-542142 A | 12/2002 |
| JP | 2005-035869 A | 2/2005 |
| JP | 2006-114845 A | 4/2006 |
| JP | 2008-504443 A | 2/2008 |
| WO | WO 00/63466 A1 | 10/2000 |
| WO | WO 01/14619 A1 | 3/2001 |
| WO | WO 01/68955 A1 | 9/2001 |
| WO | WO 2006/003381 A1 | 1/2006 |

OTHER PUBLICATIONS

G. Leibiger, U.S. PTO Office Action, U.S. Appl. No. 12/039,886, dated Jul. 8, 2011, 10 pages.

H.P. Maruska and J.J. Tietjen, "The Preparation and Properties of Vapor-Deposited Single-Crystal-Line GaN", Applied Physics Letters 15, 1969, p. 327-329.

M. Kelly et al., "Large Free-Standing GaN Substrates by Hydride Vapor Phase Epitaxy and Laser-Induced Liftoff", Jpn. J. Appl. Phys. vol. 38, 1999, p. L217-L219.

K. Motoki et al., "Preparation of Large Freestanding GaN Substrates by Hydride Vapor Phase Epitaxy Using GaAs as a Starting Substrate", Jap. J. Appl. Phys. vol. 40, 2001, p. L140-L143.

Melnik et al., "Nitride Semiconductors", Mat. Res. Soc. Symp. Proc. vol. 482, 1998, p. 269-274.

H.-M. Kim et al., "Preparation of 30×30 $mm^2$ Free-Standing GaN Wafer by Mechanical Liftoff and Optical Properties in teh Backside of the Free GaN by Cathodoluminescence", Mat. Res. Soc. Symp. Proc. vol. 639, 2001, p. G6.51.1-6.

C. Dam et al., "Carrier gas and position effects on GaN growth in a horizontal HVPE reactor: An experimental and numerical study", J. Crystal Growth 285, 2005, p. 31-40.

F. Habel, "Investigations of the Carrier Gas Composition of HVPE of GaN", Annual Report 2003, Opto-electronics Department, University of Ulm, p. 77-80.

M. Meyyappan et al., "Modeling of GaN hydride vapor phase epitaxy", J. Vac. Sci. Technol. A16, 1998, p. 685-688.

E. Richter et al., "Reactor and growth process optimization for growth of thick GaN layers on sapphire substrates by HVPE", J. Crystal Growth 277, 2005, p. 6-12.

Tomkins, H. G. et al., "Spectroscopic Ellipsometry and Reflectometry", Wiley, New York, 1999, pp. 18-23 and 84-97.

Kasic, A. et al., "Micro-Raman Scattering Profiling Studies on HVPE-Grown Free-Standing GaN", Phys. Stat. Sol., 201, No. 12, Wiley, 2004, pp. 2773-2776.

G. Leibiger et al., U.S. PTO Office Action, U.S. Appl. No. 12/039,886, dated Jan. 19, 2011, 14 pages.

Notice of Allowance in U.S. Appl. No. 12/039,886 dated Mar. 6, 2015.

G. Leibiger, U.S. PTO Official Action, U.S. Appl. No. 12/039,886, dated Aug. 12, 2014, 16 pages.

* cited by examiner

METHOD AND DEVICE FOR MANUFACTURING SEMICONDUCTOR COMPOUND MATERIALS BY MEANS OF VAPOUR PHASE EPITAXY

CROSS REFERENCE TO RELATED APPLICATIONS

This application is a Divisional of U.S. patent application Ser. No. 12/039,886, filed Feb. 29, 2008, now U.S. Pat. No. 9,074,297, which claims priority to U.S. Provisional Patent Application No. 60/892,635, filed Mar. 2, 2007, the disclosures of both of which is hereby incorporated by reference. This application also claims priority to German Application DE 10 2007 010 286.2, filed Mar. 2, 2007, the disclosure of which is hereby incorporated by reference.

BACKGROUND

The present invention relates to a method of manufacturing semiconductor compound materials from a vapour phase, specifically of III-N-layers or III-N-bulk crystals as well as of standalone III-N-substrates, which are retrieved from III-N-bulk crystals.

The invention is further related to a corresponding device, i.e., a reactor, and further to specific III-N-layers, III-N-bulk crystals or standalone III-N-substrates which comprise specific properties.

Known semiconductor compound materials may be embodied as combinations of elements of the III. and V. main groups of the periodic table of the elements. An important representative is gallium arsenide (GaAs), which serves as a base material in high frequency techniques or opto-electronics. Particularly in the field of manufacturing opto-electronic components, such as blue LEDs (Light Emitting Diodes), specific attention has been drawn in recent years to the nitrides of these semiconductor compound materials, specifically gallium nitride (GaN).

The nitrides of semiconductor compound materials are known as III-N-materials. Therein "III" denotes at least one element of the III. main group of the periodic table of elements selected from aluminium, gallium and indium (in what follows abbreviated as Al, Ga or In), and "N" stands for the element nitrogen of the V. main group. These materials can be manufactured as standalone III-N-substrates, which are well-suited as base substrates for manufacturing opto- and micro-electronic components.

Regarding industrial applications, components for (Al, Ga, or In)N-based light emitting or laser diodes have commonly been grown on foreign substrates such as $Al_2O_3$ (sapphire) or SiC (silicon carbide).

Due to employing foreign substrates, however, disadvantages with regard to crystal quality may arise. The reason is that that crystal grids do not match well with each other. This may result in a reduction in durability and efficiency of the components.

One resort is represented by the growth on standalone III-N-substrates such as (Al, Ga, or In) N-substrates. The latter have, however, not been available in sufficient quality until present. The reasons for that substantially reside in difficulties related to conventional bulk growth technologies based on a melt, which are due to an extremely large equilibrium vapour pressure of nitrogen above III-N-compounds at typical growth temperatures. Even in the case of growing indium phosphate (InP), a pressure of about 30 bar develops at corresponding temperatures. The pressure of nitrogen would attain values of the pressure some orders of magnitude larger than that.

The presently commercially available method for growing (Al, Ga, In) N-substrates is the hydride vapour phase epitaxy (HVPE). The method has already been described in 1969 by H. P. Maruska and J. J. Tietjen (Applied Physics Letters 15 (1969) p. 327-329). With this method crystal growth out of sources of elements from the III. main group, which are present in a metallic state, and out of hydrogen compounds of elements of the V. main group is carried out.

As an example, gallium is exposed to hydrogen chloride (HCl) at high temperatures of about 800-900° C. in order to manufacture gallium nitride. This mixture reacts to form gallium chloride and then encounters ammonia ($NH_3$) at even higher growth temperatures of about 1.000-1.100° C. in the vicinity of the substrate. Out of a corresponding reaction gallium nitride (GaN) is deposited on the substrate. A distinctive feature of the HVPE-method is the large growth rate of about 50-250 μm per hour at a comparatively sound crystallinity.

However, with regard to the formation of thin layers having a precise layer thickness homogeneity, the metal organic vapour phase epitaxy (MOVPE) currently prevails.

With concern to the HVPE-method there are currently substantially two variants available for growing (Al, Ga, or In) N-substrates:

The epitaxial growth of III-N-materials on foreign substrates from a vapour phase with subsequent separation from the foreign substrate, or the growth of thick III-N-bulk crystals (so called boules) on a III-N-substrate by means of vapour phase epitaxy with subsequent separation of the bulk crystal, for example by means of sawing.

Regarding variant (a), there arises a problem of how the separation of the grown materials from the foreign substrate may be accomplished. M. Kelly et al. (Jpn. J. Appl. Phys. Vol. 38, 1999, p. L217-L219) propose to strip off a thick GaN-layer grown on a substrate containing sapphire ($Al_2O_3$) by means of hydride vapour phase epitaxy (HVPE) from that substrate. The sapphire substrates covered with GaN are irradiated with a laser beam for this purpose. Consequently, the GaN-layer at the boundary towards the sapphire substrate is locally thermally decomposed and thus strips off the sapphire substrate.

Alternatively, a wet chemical etching (e.g., of GaAs: K. Motoki et al., Jap. J. Appl. Phys. Vol. 40, 2001, p. L140-L143), a dry chemical etching (e.g., of SiC: Melnik et al., Mat. Res. Soc. Symp. Proc. Vol. 482, 1998, p. 269-274) or a mechanical lapping (e.g., of sapphire: H.-M. Kim et al., Mat. Res. Soc. Symp. Proc. Vol. 639, 2001, pages G6.51.1-G6.51.6) of the substrate may be carried out.

With regard to variant (b), Vaudo et al. in U.S. Pat. No. 6,596,079 A propose a growth method of crystal boules with lengths of more than 1, 4 or 10 mm in accordance with the HVPE-method. By wire sawing and further manufacturing steps, e.g., chemical-mechanically polishing, reactive ion beam etching or photo-electronic etching, the III-N-substrates are yielded from the bulk crystal. Moreover, Vaudo et al. in WO 01/68955 A1 describe III-N-bulk crystals and III-N-substrates produced by this technology.

In order to lead the reaction gases in the reactor chamber towards the substrate, so called carrier gases are utilized. These are substantially chemically neutral, serve to adjust a desired flow profile in order to localize the reaction gases towards the substrate, and prevent the reaction gases from a premature reaction as a consequence of parasitic deposition on the reactor walls or at inner component parts of the reactor chamber.

As carrier gases are known, for example, nitrogen, hydrogen (Maruska et al. and Motoki et al.; references see above) or alternatively argon (Melnik et al.). It is also known to mix carrier gases. For example, it has been proposed to mix hydrogen and nitrogen as carrier gases in an experimentally predetermined ratio in order to improve the crystal quality that can be obtained (C. Dam et al., J. Cryst. Growth 285 (2005) p. 31-40 and F. Habel, Annual Report 2003, Optoelectronics Department, University of Ulm, p. 77-80).

However, there also arises a problem that upon variation of the mixing ratio of hydrogen with regard to, e.g. nitrogen, the flow conditions within the reactor chamber may also change with a consequence, that the homogeneity of the distribution of growth rates across the substrate may vary (C. Dam et al. and M. Meyyappan et al., J. Vac. Sci. Technol. A16 (1998), p. 685-688). Thus, it becomes difficult to control a stable flow of gases within the reactor chamber simultaneously with the efficiency of the reaction.

The present invention thus has an object to provide a method with which the crystallinity and the homogeneity of the resulting crystals may be further improved.

The object is solved by a method for manufacturing a semiconductor compound material using vapour phase epitaxy in a reactor, comprising the steps of (a) determining a volume flow of a first carrier gas in a mixture to set a predetermined value for the concentration of hydrogen at a point near a surface of a substrate; and (b) compensating for an influence exerted from step (a) on a flow profile in the reactor by determining corresponding volume flow proportions of first and second carrier gases in the mixture. The object is also achieved by a method for manufacturing a III-N-layer or a III-N-bulk crystal by means of vapour phase epitaxy in a reactor, the reactor comprising a number of gas lines for introducing carrier and reaction gases, comprising the step of: introducing three carrier gases into the reactor using the gas lines; and wherein each gas line introduces at least one carrier gas.

The object is further obtained by a reactor for manufacturing a III-N-bulk crystal or a III-N-layer on a foreign substrate by means of vapour phase epitaxy, comprising: a number of inlets each for a gas line to be formed in the reactor; and wherein at least one of the gas inlets for forming the gas line comprises supply ports for at least three carrier gases to be introduced simultaneously.

According to the invention semiconductor compound materials—doped or undoped—semiconducting or semiisolating—are manufactured. In particular, III-V-crystals are formed. Preferably, the method is employed to form III-N-crystals. Particular advantages are obtained in the case of gallium nitride-(GaN)-crystals. Other specific compounds different from the definitions as stated above are also encompassed by the invention.

According to a first aspect of the invention a semiconductor compound material is manufactured by means of vapour phase epitaxy in a reactor, wherein in a mixture of carrier gases a flow profile represented by local mass flow rates is formed in the reactor. Therein, the mixture carries one or more reaction gases towards a substrate. Thereby, a concentration of hydrogen at the surface of the substrate being important for the reaction and deposition of the reaction gases may be adjusted independently from the flow profile that is formed within the reactor.

By adjusting the concentration of hydrogen independent from the flow profile, an arbitrary flow profile can be realized for a given concentration. The capability of freely adjusting the flow profile on the other hand also allows to adjust the partial flow profile of the reaction gases supplied to the substrate in an arbitrary manner.

Hence, while the concentration of hydrogen at the surface of the substrate is employed to optimise the crystallinity of the grown material, a desired layer thickness homogeneity is obtained by controlling the flow profile. Both ingredients can be handled largely independent from each other according to the invention.

The adjustment of the concentration of hydrogen can be performed for example by employing hydrogen and nitrogen as carrier gases. The proportion of hydrogen, or the ratio between hydrogen and nitrogen, is adjusted to directly influence the concentration of hydrogen at the crystal surface.

By means of nitrogen and a further carrier gas, for example argon, which has a specific carrier gas weight different from nitrogen, the flow profile can be influenced, such that the inevitable influence of the proportion of hydrogen in the carrier gas mixture on the flow profile is compensated.

On the one hand the flow profile depends on the dimensions and the shape of the inner space of the reactor, which may be cylindrical.

On the other hand the reactor may, for example, have concentric ring-like gas inlets in order to form carrier gas lines and reaction gas lines in the laminar stream. In case the gas inlets provide differing densities with regard to the gas lines which are inlet into the chamber at the respective radius positions, this condition will adversely exert an influence on the flow profile, which is dominated by the local mass flow rates (momentum flow).

By adjusting respective proportions of the volume stream, for example via a mixture ratio of the two further carrier gases being set to depend on the position of the currently considered carrier gas line, the desired flow profile can be obtained. It has been found, that the volume stream proportion of hydrogen does not necessarily have to be fixed to a predetermined mixture ratio with regard to nitrogen. Rather, that volume stream proportion may be selected being decoupled from this ratio. A lower amount of hydrogen (for example in order to reduce the $H_2$-concentration) can be compensated by a larger amount with regard to the mixture ratio of the heavier carrier gas (e.g., argon) relative to the lighter carrier gas (e.g. nitrogen). As a result, the local mass flow rate and thus the flow profile can be maintained.

Similarly, the mass flow rate can be increased by adjusting the mixture ratio of the two heavier carrier gases, in order to vary the distribution of growth rates on the substrate. The hydrogen concentration at the substrate surface can thereby be maintained at a constant value.

According to a further aspect of the invention, a vapour phase epitaxy method is performed in a reactor, which has a number of gas lines which each may inlet carrier gases and partially reaction gases. In at least one of the gas lines of the reactor, a chemically inert carrier gas is simultaneously introduced—preferably during the growth phase—with hydrogen as well as nitrogen.

The first chemically inert carrier gas may be argon. Other carrier gases, particularly noble gases such as helium, etc. may be employed as well.

According to a method of the invention, the semiconductor compound material to be manufactured may be a III-N-crystal, particularly a III-N-layer on a foreign substrate or a III-N-bulk substrate.

The III-N-crystal to be manufactured may comprise gallium nitride, wherein the gallium nitride is formed in monocrystalline manner due to a reaction of the introduced reaction gases with subsequent deposition on the substrate in the reactor.

As a substrate may be employed, for example: sapphire, silicon, silicon carbide, diamond, lithium gallate, lithium aluminate, zinc oxide, spinel, magnesium oxide, $ScAlMgO_4$, GaAs, GaN, AlN, InN, AlGaN or InGaN.

Further aspects, advantages and embodiments are evident from the appended claims.

Figure 2:
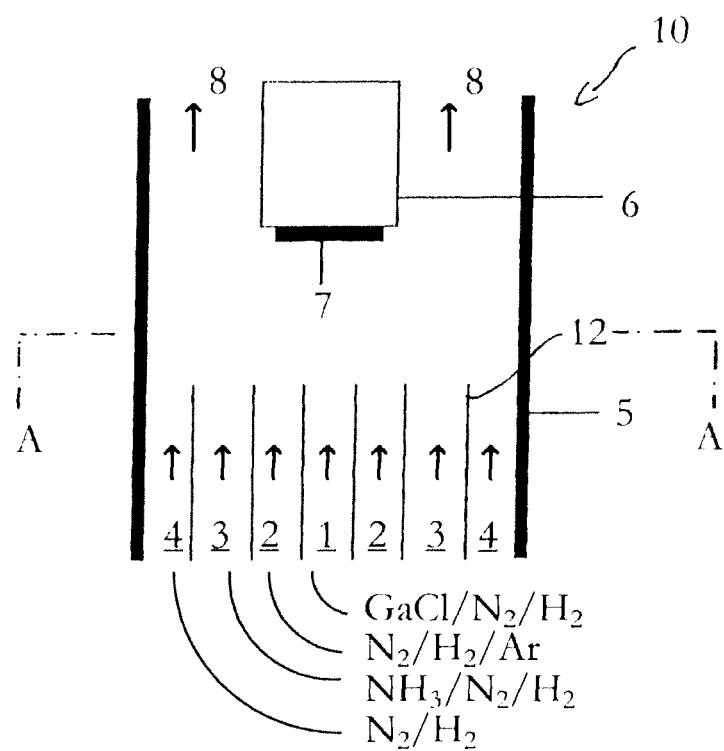
Figure 3:
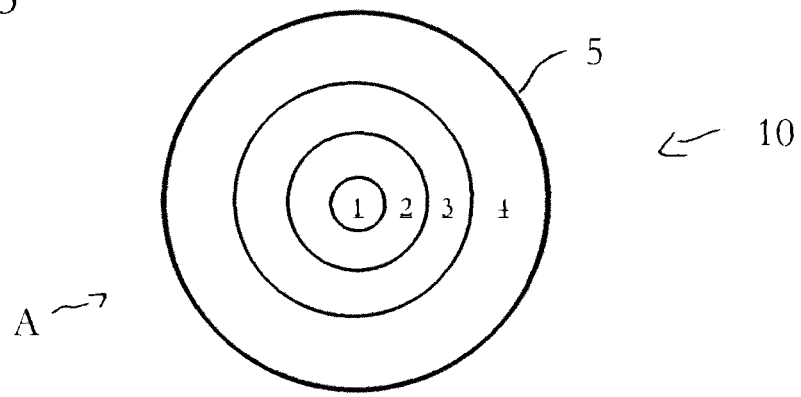
Figure 4:
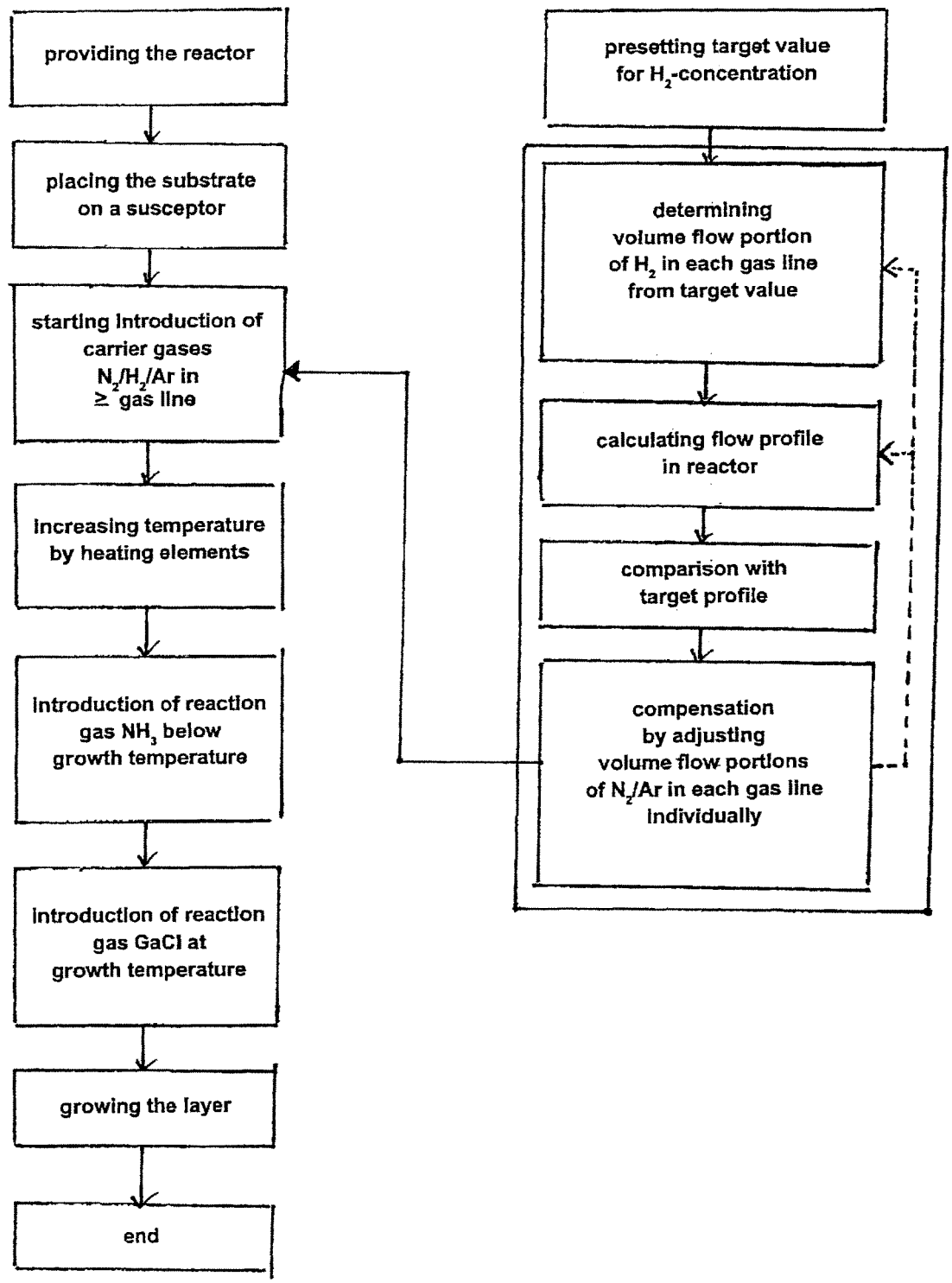

The invention will now be explained in more detail by means of embodiments with reference to the drawings. Therein:

FIG. 1: shows in a schematical representation the configuration of a horizontal HVPE arrangement, with which the invention is carried out with respect to a first embodiment;

FIG. 2: same as FIG. 1, but with respect to a vertical HVPE-arrangement, in which the invention is carried out with respect to a second embodiment;

FIG. 3: same as FIG. 2, but in cross-section indicating the concentric rings for the individual gas inlets corresponding to the gas lines;

FIG. 4: an exemplary sequence of steps according to the method of the invention.

In the embodiments, an HVPE-arrangement is modified, such that at least one of the carrier gas lines is adjusted to carry a mixture of hydrogen, nitrogen and argon with respective volume stream percentages ranging from 0% to 100%.

FIG. 1 shows in a schematical representation an example of a basic configuration of a HVPE-arrangement in cross-section, to which the present invention may be applied. In the present case, a GaN-layer is to be deposited on a template, for example a foreign substrate or a GaN-substrate.

Prior to the growth procedure, the start or seed substrate 16 is provided. The GaN-substrate has for example a diameter of more than 5 cm at a (0001)-orientation, or at a slight inclination of the substrate surface against the exact (0001)-plane.

The HVPE-arrangement 20 includes a horizontal glass reactor 21 according to one possible embodiment, further a multi-zone furnace 22 enclosing the reactor, gas inlets 23, 23' indicated by arrows and a pump and discharge system 24 also indicated by an arrow.

The GaN-substrate 16 is introduced into the reactor 21 through the load-unload flange 25 and positioned on a substrate holder 26. Using the pump and discharge system 24, the reactor is brought to the desired process pressure, suitably in the range of ≤1.000 mbar, for example to a pressure of about 950 mbar.

The multi-zone furnace has a first zone 22A, with which the growth temperature of the surface of the substrate is set, and a second zone 22B, with which the temperature in the area of a Ga-tray 28 is set. Via the gas inlets 23, 23' Ar, $H_2$ and $N_2$ as carrier gases are inlet into the reactor. The gas inlets 23, 23' each define one carrier gas line.

For the purpose of an in situ generation of gallium chloride (GaCl), gallium (Ga) provided in the Ga-tray is heated to, e.g., 850° C. by adjusting a suitable temperature in the zone 22B of the multi-zone furnace 22. The gallium is then processed with hydrogen chloride (HCl), which is supplied from the gas supply 23 together with the $Ar/H_2/N_2$-carrier gas in a suitable gas mixture ratio and under a suitable flow rate.

The gallium chloride (GaCl) generated in situ flows from the openings indicated in FIG. 1 at the end of the inflow tube 23 into the reactor 21, and is mixed there with ammonia ($NH_3$), which is introduced from the gas inlet 23' together with one of the two $Ar/H_2/N_2$-carrier gas mixtures in suitable gas mixture ratio and under a suitable flow rate for adjusting a desired $NH_3$ partial pressure of, e.g. about, 6 to $7 \times 10^3$ Pa.

The chemical reaction of gallium chloride with ammonia ($NH_3$) takes place in order to yield gallium nitride (GaN). Further, hydrogen chloride (HCl) as well as hydrogen ($H_2$) are generated as side products, which leave the system together with the other carrier gases via the pump and discharge system 24.

At the surface of the substrate 16 the hydrogen generated as stated above contributes to a local concentration of hydrogen in conjunction with that hydrogen, which has been supplied as a carrier gas. This may influence the local behaviour of the reaction sustainably, since it increases for example the surface mobility of the species. Consequently, the volume flow rate of hydrogen introduced through both gas lines according to this embodiment may be adjusted to an optimised value, which may be experimentally determined. Such determination may for example be carried out by investigations of the surface morphology as provided in Habel (see above). The determined value of the volume flow portion necessary to achieve a target concentration of hydrogen will generally have to be derived for each reactor separately.

The local concentration of hydrogen is mainly determined by the supply of the carrier gas and only to a lesser degree by hydrogen as a side product of the reaction.

The volume flow rate of each gas line can be different from next one. This also depends on the flow profile in the reactor 20. In case the flow profile differs, or if the mass flow rates of both gas lines are not adapted to each other, then the mixture ratios of the other two carrier gases Ar and $N_2$ are adapted to each other for each of the carrier gas lines associated with the gas inlets 23, 23'. The mixture ratios can particularly be different, such that the modification in the flow profile due to the adoption of the volume flow of $H_2$ is just compensated.

As can be seen from the temperature profile in the bottom part of FIG. 1, a temperature is adjusted in the zone 22A of the multi-zone furnace 22 being comparatively larger than that of the zone 22B to achieve a substrate temperature suitably of about 950-1.100° C., e.g., about 1.050° C. In this embodiment GaN is deposited on the substrate holder.

If for example a (Ga, Al, or In)N—, a (Ga, Al)N— or a (Ga, In)N-layer is to be deposited instead of a GaN-layer, further trays for Al— and/or In have to be provided in the HVPE-arrangement 20. The inflow of corresponding aluminium and/or indium chloride into the reactor is effected by supply of HCl in a suitable carrier gas of for example $H_2/N_2$, analogously to what is shown in FIG. 1 by the gas inlet 23 for Ga.

FIGS. 2 and 3 show in schematical representation a second embodiment of a vertical reactor 10 in cross-sectional profile, which can be realized with the invention. Herein, a vertical AIXTRON HVPE-reactor is concerned for example. As in the previous embodiment, a crystalline layer of GaN is formed on a foreign substrate made from sapphire (template 7), for example.

After achieving the growth temperature, the III-N-crystal growth (i.e., of GaN) is started by connecting the supply of the group-III-source material (i.e., Ga). This means for example in the case of the GaN-bulk crystal growth, that hydrogen chloride gas is led over the gallium-source, wherein gallium chloride gas is yielded as in the first embodiment.

Prior to the start of the III-N-crystal growth, a suitable composition of hydrogen, nitrogen and argon is adjusted in the carrier gas lines. This step will generally last until stable gas flows have been formed. The corresponding compositions in the carrier gas lines are chosen on the one hand, such that at the substrate surface a concentration of hydrogen is provided which may achieve an optimum crystal quality.

On the other hand the respective portion of argon within the carrier gas lines ensures that a balancing of the respective momentum flows leads to a homogenous distribution of growth rates on the substrate. Therein, the effect of an additional use of argon is based on the fact that argon is heavier than nitrogen, whereas hydrogen is lighter as nitrogen. As a result the momentum flows can be balanced by varying the flow of argon with the proportion of hydrogen.

In addition to the connection to the supply of group-III-source materials (herein Ga) corresponding source materials intended for doping may selectively be connected for supply.

A modified embodiment of the AIXTRON HVPE-reactor will now be described: as a substrate 7 in this embodiment a GaN-substrate having a diameter between 50 and 60 mm may be chosen. The reactor is constructed such that not only in the separation line, which separates the ammonia and gallium chloride line from each other, but also in the peripheral wall purge line an arbitrary mixture of the three carrier gases hydrogen, argon and nitrogen can be adjusted. More specifically, the adjustment may concern each of the different volume flow rates, or the mass flow rates, respectively. The HVPE-process is carried out for example at a temperature of about 1.050° C. and at a pressure of 800 mbar with a V/III-mixture ratio of about 35.

The carrier gas flow in the separation line (gas inlet 2) amounts to 50 Vol.-% of hydrogen, 30 Vol.-% of argon and of 20 Vol.-% of nitrogen. The carrier gas flow in the peripheral wall purge line (gas inlet 4) is composed as follows: 53 Vol.-% hydrogen and 47 Vol.-% nitrogen. The mean growth rate amounts to about 220 μm/h and is determined by layer thickness mapping applying ellipsometry.

The layer thickness distribution has in this experiment been determined by mapping the surface by means of an in situ-ellipsometer M2000 by J. A. Woollam Co., Lincoln, Nebr., U.S.A. The pitch of measurement points in each two directions perpendicular with respect to each other on the surface amounted to about 5 mm. Therein, from each spectrum the ellipsometric parameters Psi and Delta have been used to determine the layer thickness by means of model simulation (cf. H. G. Thomkins et al. in "Spectroscopic Ellipsometry and Reflectrometry", Wiley, New York, 1989).

The homogeneity of the distribution of growth rates further determined thereby is defined by the statistical standard deviation of the measured layer thicknesses. The standard deviation amounts to less than 10% according to the invention, in one embodiment even less than 7%—with consideration of an edge exclusion area of 4 mm. Particularly note-worthy is the degree of a crystallinity yielded simultaneously with the layer thickness homogeneity, which will be detailed below.

In the concentric, vertical construction as shown in FIGS. 2 and 3 the flow profile is dominated by the momentum, i.e., masses and flow rates of the gases discharged from the individual gas inlets. If for example a comparatively heavy gas such as nitrogen flows in the peripheral purge line and a comparatively light gas such as hydrogen flows in the inner separation line, then the nitrogen urges inwards resulting in a convex growth rate profile, since the largest growth rate is obtained in the substrate centre. According to the invention, argon or another heavy gas may be provided additionally in the separation line for example, in order to re-shape the growth profile towards a concave form. The effect is caused by the larger mass of the gases flowing inwards.

In a reverse case, a third, lighter gas can be provided in the peripheral wall purge line as a carrier gas.

The effect of argon may be explained as follows: by the larger mass of argon as compared with nitrogen, the momentum flow of an outer nitrogen dominated gas line can be compensated by adding argon to hydrogen in an inner gas line. Consequently, a constant homogeneous growth rate profile may be achieved.

Basically, this would also be accomplished by varying only the ratio of $N_2$ to H. However, this ratio is fixed ("pinned"), since the $H_2$-concentration, or the ratio relative to $N_2$ at the surface of the substrate, has to attain a predetermined value in order to obtain an optimum crystal quality.

An exemplary sequence of steps according to the method of the invention is shown in FIG. 4. On the left side of the chart, the sequence of steps substantially reflects what has been detailed in the above two embodiments. The individual steps are partly to be understood as processes overlapping each other in time. For example, the carrier gases are introduced prior to the reacting gases, but the respective flows are of course maintained during the growth phase.

On the right side of FIG. 4, the determination of the volume flow proportions for the three carrier gases is schematically represented. A target concentration of $H_2$ at the surface is preset. From this value, a volume flow portion of $H_2$ in the gas line(s) is derived, which is necessary in order to achieve the target concentration. The relation can be calculated by means of simulating the flows at the substrate surface.

The simulations may also include the determination of the volume flow proportions of $N_2$ and Ar. The basic principle is to achieve a flow profile as a target value. By adjusting the volume flow proportions of $N_2$ and Ar (e.g., as compared with standard settings for these values) which may represent free parameters, a deviation from the target profile due to the calculated $H_2$-volume flow proportion may be compensated. The dashed lines in FIG. 4 indicate that optionally an iterative process may be required.

The determination of the concentrations and flow profiles by experiment and measurement and the adjustment of the volume flow portions responsive thereto is basically encompassed by the invention.

In a further embodiment of the invention, a III-N-substrate having a c-, a-, m- or r-plane as the growth plane is used as the substrate, and the III-N-bulk crystal is deposited on the selected growth plane.

In a further embodiment of the invention a III-N-substrate having a growth plane is used, which is inclined relative to the c-, a-, m- or r-plane by 0.1-30°, wherein the III-N-bulk crystal is deposited thereupon.

In a still further embodiment of the invention, a doped III-N-substrate is used as the substrate. On the substrate a doped III-N-bulk crystal is deposited, wherein as dopants each one element is employed selected from the group comprising silicon, tellurium, magnesium and iron.

According to the invention single crystalline sapphire, silicon carbide, gallium arsenide, lithium aluminate or silicon can further be used as the substrate. The III-N-bulk crystal is then deposited on this substrate. In a particularly preferred embodiment GaN-substrate is used as the substrate in free-standing form or in template-form, and a GaN-bulk crystal is then grown according to the invention.

After the method according to the invention has been carried out, freestanding III-N-crystal substrates can be manufactured in a simple manner by separating one or more III-N-substrates from the III-N-bulk crystal. A particularly suited method for separation is represented by wire-sawing. Adjacently, further processing steps may follow, particularly lapping, polishing, thermal post processing and/or arbitrary final cleaning steps.

According to the invention there is further provided a III-N-bulk crystal, which is available according to the method of the invention. Preferably, the crystal is manufactured according to the methods as provided in the appended claims or in the present embodiments. In conjunction with the bulk crystal also the single crystal obtained by separation due to wire- or inner hole-sawing inherits the excellent characteristics with concern to crystallinity and layer thickness homogeneity.

A correspondingly manufactured III-N-crystal surprises by its unique crystallinity. This also holds true for the correspondingly separated, free-standing III-N-substrates. Particular emphasis has to be laid on the effect, that the crystallinity is obtained simultaneously and in combination with a high layer thickness homogeneity. As explained above with reference to the embodiments, the layer thickness homogeneity according to the invention amounts to less than 10%, in one embodiment even less than 7% in consideration of an edge exclusion area of 4 mm.

The crystallinity of the crystal can be defined particularly by means of rocking-curve mapping and/or by micro-raman-mapping.

Therein, the spatial distribution of absolute positions or the full-widths half-means of the X-ray diffraction curves corresponding to the diffraction at predetermined grid plane bands is recorded for example by means of X-ray diffraction in metrological manner. The homogeneity of the crystal quality (crystallinity) in the growth plane may in the case of rocking-curve mapping be examined by recording of ω-scans at distinct probe locations. The co-scan is recorded within a plane parallel to the growth plane. In the case of growth in [0001]-direction the reflection of the (0002)-grid planes can be used for the co-scans.

The homogeneity of the crystal quality in the growth direction, however, may be determined by means of the standard deviation of the mean values of the full-width half-means of the (0002) co-scans of individual substrates obtained from corresponding III-N-bulk crystals.

Alternatively, the homogeneity of the crystal quality in the growth direction can be determined by the rocking-curve-mapping, which is recorded within a plane including the growth direction. Regarding the growth in [0001]-direction, the reflection at an m-plane selected from $\{\bar{1}100\}$, or from $\{(10\bar{1}0), (01\bar{1}0), (\bar{1}100), (0\bar{1}10), (1\bar{1}00)\}$ respectively, may be utilized with the Ω-scans. The mapping is performed on a corresponding m-plane or a plane which is slightly inclined with respect to the corresponding m-plane by an inclination angle between 0 and 10°.

A second method for determining the homogeneity of the crystal quality relates to micro-Raman-mappings. For example the standard deviations of the frequency and the full-width half-mean of the $E_2$-phonon of a scan on an area parallel to the growth plane, or along the growth direction, represent a measure for the homogeneity of the crystal quality in corresponding directions. The homogeneity of the crystal quality of the bulk crystal in growth direction is preferably determined by the standard deviation of the mean values of the full-width half-mean of the $E_2$-phonon of the individual substrates, which have been obtained from the corresponding bulk crystal.

The following results have been obtained for a crystal grown according to the invention:

In a rocking-curve mapping of a III-N-bulk crystal according to the invention of an area parallel to the growth plane, the standard deviation of respectively measured full-width half-mean values amounts to 5% or less, in exceptional cases 3% or less. Within an area extending along the growth direction the full-width half-mean amounts to 10% or less, in exceptional cases 7.5%, and in particularly exceptional cases 5% or less.

The standard deviation has been determined by performing at multiple measurement points, for example 100 points, in those areas intended to be measured each a measurement for the rocking curve-mapping. Of all measurements a mean value of the full-width half-means has been calculated and the standard deviation has been derived with respect to that mean value via a common statistical analysis.

Alternatively, the crystallinity could be determined via a micro-Raman-mapping of the III-N-bulk crystal on a plane parallel to the growth plane and/or along growth direction. The standard deviation of the measured full-width half-means of the $E_2$-phonon is then provided. In the first case (area parallel to the growth plane) the standard deviation amounts to 5% or less, in exceptional cases 3% or less, in particularly exceptional cases 2% or less. In the second case the standard deviation amounts to 10% or less, in exceptional cases 7.5% or less, and in particularly exceptional cases 5% or less. The measurement has been carried out analogously to that of the rocking-curve mapping over, e.g., 100 measurement points.

The values provided with regard to crystallinity hold particularly true for the obtained GaN-crystals. It shall be repeatedly emphasized herein the combination of the excellent values for crystallinity with those for the layer thickness homogeneity, which may be obtained according to the invention.

The invention claimed is:

1. A III-N bulk crystal as grown having a diameter of 5 cm (2 inches) or more,
   the III-N bulk crystal comprising a thickness layer homogeneity with a standard deviation of 7% or less relative to the layer thickness,
   wherein a surface of the crystal is mapped at multiple measurement points arranged across the surface at a pitch of 5 mm in each of two directions perpendicular to each other and an exclusion from the substrate edge of 4 mm is applied, and
   wherein in a rocking curve-mapping of an area parallel to the growth plane, and including 100 measurement points arranged in corresponding directions, the standard deviation of the full-width half-mean measured amounts to 3% or less.

2. The III-N bulk crystal according to claim 1, wherein in a micro-Raman-mapping of an area parallel to the growth plane, and including 100 measurement points arranged in corresponding directions, the standard deviation of the full-width half-mean being measured of the E2-phonon amounts to 3% or less.

3. A III-N-single crystal, obtained by separation of the III-N bulk crystal according to claim 1.

4. A III-N bulk crystal according to claim 1, further comprising constituents of a noble gas built in the crystal.

5. A III-N bulk crystal according to claim 1, further comprising constituents of a noble gas absorbed in the crystal.

6. A III-N bulk crystal according to claim 1, further comprising constituents of a chemically inert gas absorbed in the crystal.

7. A III-N bulk crystal according to claim 4, wherein the noble gas is helium or argon.

8. A III-N bulk crystal according to claim 5, wherein the noble gas is helium or argon.

9. The III-N bulk crystal according to claim 2, wherein the standard deviation of the full-width half-mean of the E2-phonon amounts to 2% or less.

10. A III-N bulk crystal as grown having a diameter of 5 cm (2 inches) or more, prepared by a hydride vapor phase epitaxy (HVPE) process in a vertical reactor, the process comprising the steps of:
 (a) introducing a mixture of carrier gases into the vertical reactor via concentrically arranged gas inlets to carry one or more reaction gases in a direction towards a substrate;
 (b) determining a volume flow of hydrogen as a first carrier gas in the mixture to set a predetermined value for the concentration of hydrogen at a point near a surface of the substrate; and
 (c) compensating for an influence exerted from step (b) on at least one of the concentrically arranged gas inlets in a laminar flow profile represented by a distribution of local mass flow rates in each of said concentrically arranged gas inlets in the reactor by determining corresponding volume flow proportions of a second and a third carrier gases in the mixture in at least another one of the concentrically arranged gas inlets.

11. A III-N-bulk crystal as grown having a diameter of 5 cm (2 inches) or more, prepared by a vapor phase epitaxy process in a reactor having a number of gas lines for introducing carrier and/or reaction gases, the process comprising:
 introducing three carrier gases into the reactor using the gas lines;
 wherein
  each gas line introduces at least one carrier gas,
  hydrogen as a first carrier gas and nitrogen as a second carrier gas are introduced in at least one of the gas lines simultaneously,
  at least one of the gas lines is a separation line in which at least a third carrier gas is introduced without introducing reaction gas, and which separates two reaction-gas-carrying gas lines from one another, and
  the third carrier gas has a specific gas weight different from that of hydrogen and nitrogen,
 wherein when the third carrier gas is introduced into the separation line, the third carrier gas is not introduced as a carrier gas into the two reaction-gas-carrying gas lines separated from each other by the separation line, and
 wherein proportions of the three carrier gasses in each of the gas lines are selected to maintain homogenous local mass flow rates to effect a laminar flow of the gasses in the reactor.

\* \* \* \* \*